(12) United States Patent
Chen et al.

(10) Patent No.: US 8,723,185 B2
(45) Date of Patent: May 13, 2014

(54) REDUCING WAFER DISTORTION THROUGH A HIGH CTE LAYER

(75) Inventors: Chi-Ming Chen, Zhubei (TW); Chung-Yi Yu, Hsin-Chu (TW); Chia-Shiung Tsai, Hsin-Chu (TW); Ho-Yung David Hwang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 380 days.

(21) Appl. No.: 12/956,145

(22) Filed: Nov. 30, 2010

(65) Prior Publication Data
US 2012/0132921 A1    May 31, 2012

(51) Int. Cl.
*H01L 29/20* (2006.01)
*H01L 21/20* (2006.01)
*H01L 21/18* (2006.01)

(52) U.S. Cl.
USPC ............ 257/76; 257/E21.087; 257/E21.09; 257/E29.089; 438/459; 438/478

(58) Field of Classification Search
USPC ............ 257/76, 77, 194, E21.087, E21.09; 438/39, 478, 795
See application file for complete search history.

(56) References Cited

U.S. PATENT DOCUMENTS

| | | | |
|---|---|---|---|
| 7,112,830 B2 | 9/2006 | Munns | |
| 7,468,524 B2 * | 12/2008 | Teraguchi | 257/27 |
| 7,547,925 B2 | 6/2009 | Wong et al. | |
| 7,598,108 B2 | 10/2009 | Li et al. | |
| 2001/0003620 A1 * | 6/2001 | Dubots et al. | 428/446 |
| 2002/0123164 A1 * | 9/2002 | Slater et al. | 438/39 |
| 2003/0033974 A1 * | 2/2003 | Ueda | 117/84 |
| 2006/0202209 A1 * | 9/2006 | Kelman et al. | 257/77 |
| 2007/0108456 A1 | 5/2007 | Wong et al. | |
| 2007/0275570 A1 * | 11/2007 | Nakamura et al. | 438/795 |
| 2008/0179547 A1 * | 7/2008 | Henley | 250/492.21 |
| 2008/0283870 A1 * | 11/2008 | Sato | 257/194 |
| 2010/0084687 A1 * | 4/2010 | Chen et al. | 257/194 |
| 2010/0193843 A1 * | 8/2010 | Lee et al. | 257/201 |

* cited by examiner

*Primary Examiner* — Lex Malsawma
*Assistant Examiner* — Sheng Zhu
(74) *Attorney, Agent, or Firm* — Haynes and Boone, LLP (57) ABSTRACT

Provided is a method of fabricating a semiconductor device. The method includes providing a silicon substrate having opposite first and second sides. At least one of the first and second sides includes a silicon (111) surface. The method includes forming a high coefficient-of-thermal-expansion (CTE) layer on the first side of the silicon substrate. The high CTE layer has a CTE greater than the CTE of silicon. The method includes forming a buffer layer over the second side of the silicon substrate. The buffer layer has a CTE greater than the CTE of silicon. The method includes forming a III-V family layer over the buffer layer. The III-V family layer has a CTE greater than the CTE of the buffer layer.

19 Claims, 11 Drawing Sheets

REDUCING WAFER DISTORTION THROUGH A HIGH CTE LAYER

BACKGROUND

The semiconductor integrated circuit (IC) industry has experienced rapid growth in recent years. Technological advances in IC materials and design have produced various types of ICs that serve different purposes. The fabrication of some types of ICs may require forming a III-V family layer on a substrate, for example forming a gallium nitride layer on a substrate. These types of IC devices may include, as examples, light-emitting diode (LED) devices, radio frequency (RF) devices, and high power semiconductor devices.

Traditionally, manufacturers have formed the III-V family layer on a sapphire substrate. However, sapphire substrates are expensive. Thus, some manufacturers have been attempting to form III-V layers on a silicon substrate, which is cheaper. However, existing methods of forming a III-V family layer on a silicon substrate may result in wafer bending or distortion, especially if the fabrication involves drastic temperature changes. The wafer distortion may lead to wafer defects, which reduces yield and degrades device performance.

Therefore, while existing methods of forming III-V family layers on silicon substrates have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the features are formed in direct contact, and may also include embodiments in which additional features may be formed interposing the features, such that the features may not be in direct contact. Various features may be arbitrarily drawn in different scales for the sake of simplicity and clarity.

Figure 1:
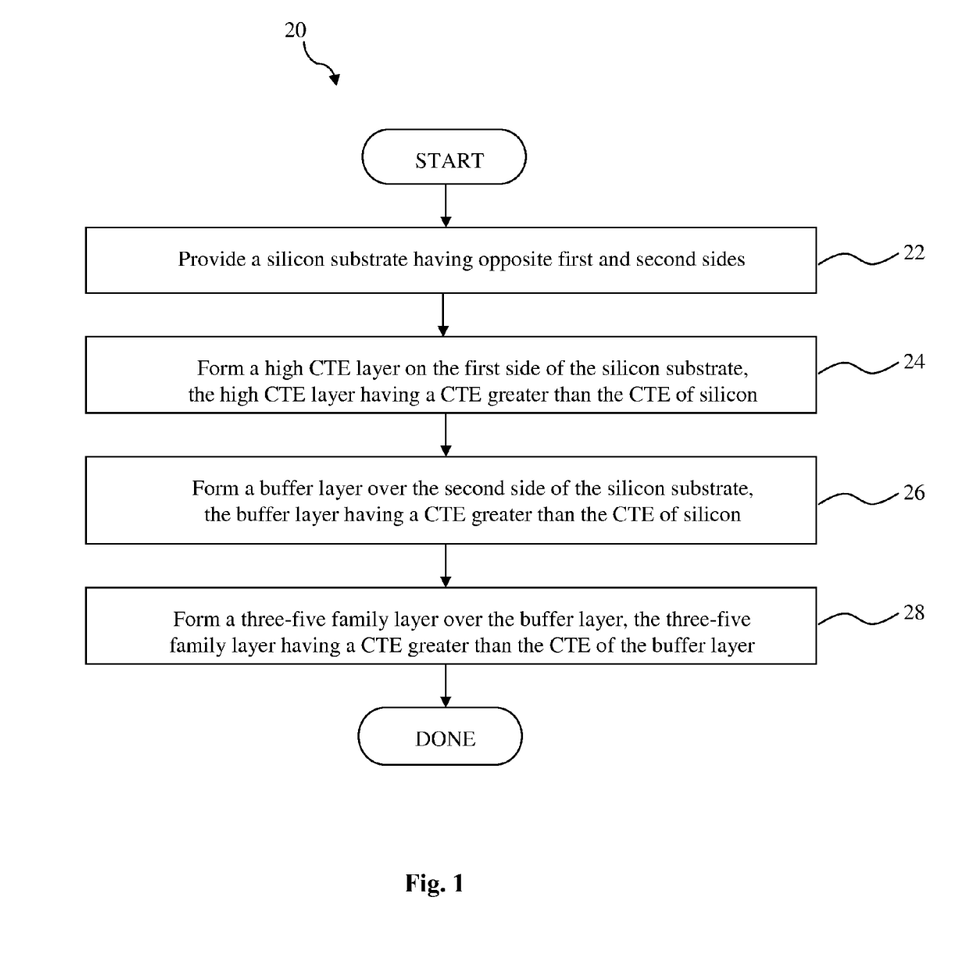
FIG. 1 is a flowchart illustrating a method for fabricating a semiconductor device according to various aspects of the present disclosure.

Illustrated in FIG. 1 is a flowchart of a method 20 for fabricating a semiconductor device according to various aspects of the present disclosure. Referring to FIG. 1, the method 20 begins with block 22, in which a silicon substrate having opposite first and second sides is provided. The method continues with block 24, in which a high coefficient-of-thermal-expansion (CTE) layer is formed on the first side of the silicon substrate. The high CTE layer has a CTE greater than the CTE of silicon. The method 20 continues with block 26, in which a buffer layer is formed over the second side of the silicon substrate. The buffer layer has a CTE greater than the CTE of silicon. The method 20 continues with block 28, in which a III-V family layer is formed over the buffer layer. The III-V family layer has a CTE that is greater than the CTE of the buffer layer.

FIGS. 2 to 6 are diagrammatic fragmentary cross-sectional side views of a semiconductor device at various fabrication stages according to embodiments of the method 20 of FIG. 1. It is understood that FIGS. 2 to 6 have been simplified for a better understanding of the inventive concepts of the present disclosure.

Figure 2:
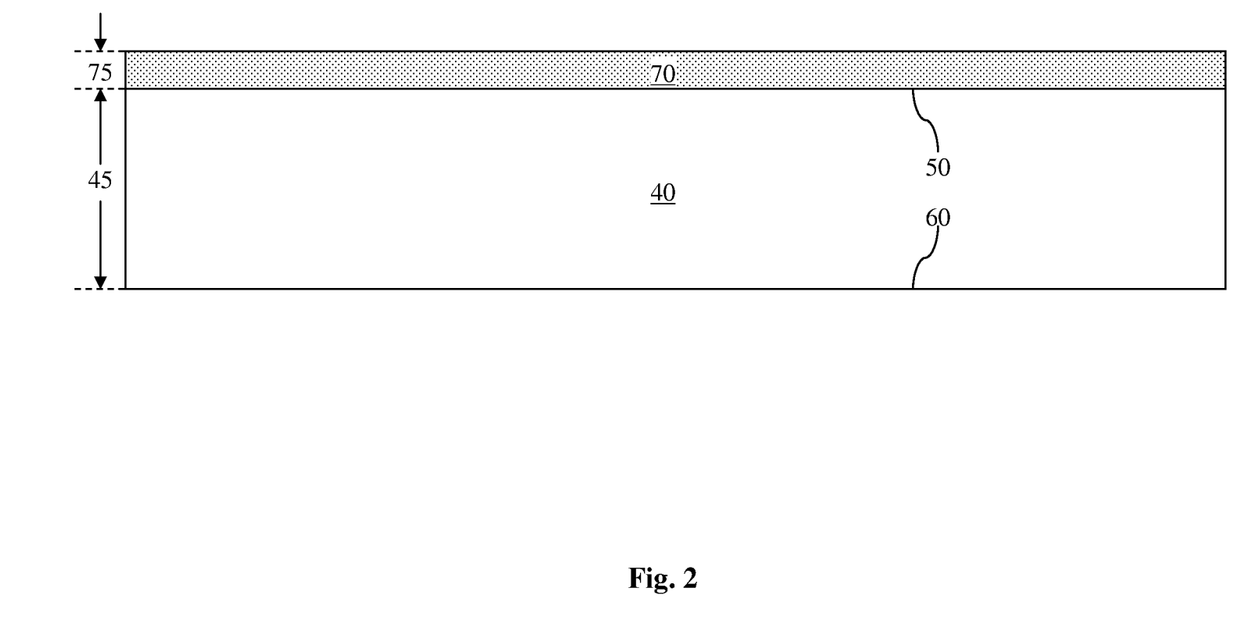
FIGS. 2-6 are diagrammatic fragmentary cross-sectional side views of a portion of a semiconductor device at various stages of fabrication in accordance with various aspects of the present disclosure.

Referring to FIG. 2, a silicon wafer 40 is provided. The silicon wafer 40 may also be referred to as a silicon substrate 40. The silicon wafer 40 has a thickness 45. In an embodiment, the thickness 45 is in a range from about 500 microns (um) to about 1000 um. The silicon wafer 40 also has a side or a surface 50, and a side or a surface 60 that is located opposite the side 50. Since the side 50 is located above the side 60 in FIG. 2, the side 50 may also be referred to as a front side, and the side 60 may also be referred to as a backside.

The side 50 and side 60 each have a silicon (111) surface. The silicon (111) surface is obtained by cleaving or cutting the silicon along a (111) lattice plane defined according to a Miller Index. In an embodiment, the silicon wafer 40 has a lattice constant that is in a range from about 3.8 angstroms to about 3.9 angstroms, and a coefficient-of-thermal-expansion (CTE) that is in a range from about $2.5 \times 10^{-6}/°$ C. to about $2.7 \times 10^{-6}/°$ C. It is understood that all the lattice constants discussed in this disclosure are measured at about 300 degrees Kelvin.

The silicon wafer 40 is chosen to have the silicon (111) surface because it has a relatively small mismatch with a buffer layer (containing a gallium nitride material or an aluminum gallium nitride material), which will be formed on the silicon (111) surface in the following process. Had a different silicon surface been used, such as a silicon (100) surface, the mismatch between the silicon (100) surface and the buffer layer would have been greater and consequently would have led to more fabrication difficulties.

A buffer layer 70 is formed on the side 50 of the silicon wafer 40. The buffer layer 70 has a thickness 75. In an embodiment, the thickness 75 is in a range from about 1 um to about 2 um. The buffer layer 70 may be formed by a metal-organic chemical vapor deposition (MOCVD) process. In an embodiment, the MOCVD process is performed at a temperature in a range from about 800 degrees Celsius to about 1400 degrees Celsius, and for a process duration time in a range from about 1 hour to about 3 hours.

The buffer layer 70 may include a plurality of thin layers of aluminum nitride or aluminum gallium nitride. These thin layers of aluminum nitride or aluminum gallium nitride may each be as thin as a few nanometers (nm) or tens of nanometers. An aluminum nitride material may have a lattice constant that is in a range from about 2.9 to about 3.3 and a CTE that is in a range from about $3.8 \times 10^{-6}/°$ C. to about $4.5 \times 10^{-6}/°$ C. The lattice constant and the CTE of an aluminum gallium nitride material are close to those of the aluminum nitride. Therefore, the buffer layer 70 and the silicon wafer 40 have mismatched CTEs.

In one embodiment, the buffer layer 70 is implemented as a low temperature aluminum nitride structure, in which a plurality of aluminum nitride layers as thin as a few nanometers are interleaved with a plurality of gallium nitride layers as thin as a few hundred nanometers. In another embodiment, the buffer layer 70 is implemented as a super-lattice structure, in which a gallium nitride/aluminum nitride super-lattice is formed at high temperatures, for example temperatures as high as about 1050 degrees Celsius. In yet another embodiment, the buffer layer is implemented as a step graded aluminum gallium nitride structure. In an embodiment, the step graded aluminum gallium nitride structure includes aluminum nitride layers, a graded aluminum gallium nitride layer, and a fixed aluminum gallium nitride layer. These layers may be formed at different temperatures. It is understood that the buffer layer 70 is not limited to the structures discussed above, and may be implemented differently in other embodiments.

After the buffer layer 70 is formed, the silicon wafer 40 and the buffer layer 70 are cooled down to about a room temperature, which is in a range from about 20 degrees Celsius to about 30 degrees Celsius in an embodiment. During the cooling, the CTE mismatch between the buffer layer 70 and the silicon wafer 40 means that the buffer layer 70 and the silicon wafer contract at different rates. In more detail, since the CTE of the buffer layer 70 is greater than the CTE of the silicon wafer, a tensile stress is generated. In general, stress is a measure of internal forces acting within a deformable body. A tensile stress involves a force acting outward from the plane, whereas a compressive stress involves a force acting inward to a plane. Here, the tensile stress pulls the edges of the silicon wafer 40 upwards, resulting in a slightly concave shape. It may be said that the wafer 40 is slightly distorted, which is also referred to as wafer bow. For the sake of simplicity, the wafer distortion is not shown in FIG. 2.

Figure 3:
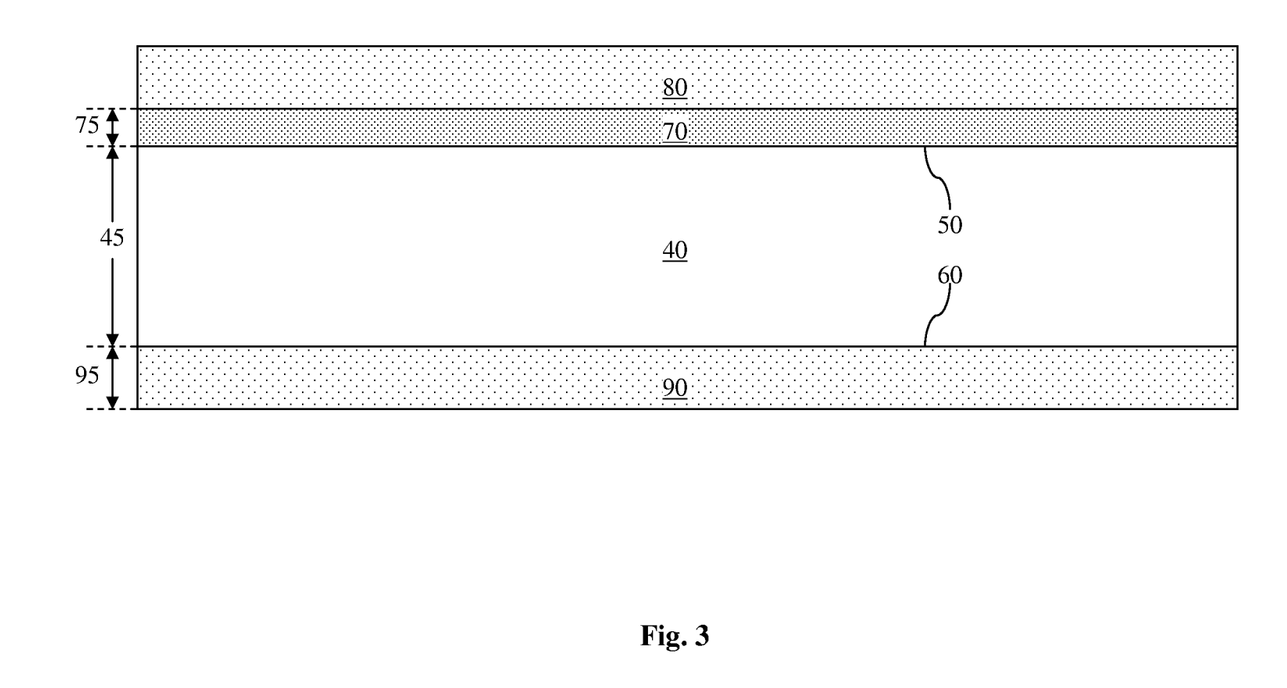

Referring now to FIG. 3, high CTE layers 80 and 90 are formed on the buffer 70 and the side 60 of the silicon wafer, respectively. The high CTE layers 80 and 90 each have a CTE that is greater than about $3 \times 10^{-6}/°$ C. In an embodiment, the high CTE layers 80 and 90 each include a silicon nitride material. The silicon nitride material has a CTE that is in a range from about $3 \times 10^{-6}/°$ C. to about $3.4 \times 10^{-6}/°$ C., which is higher than that of silicon.

The high CTE layers 80 and 90 are formed using a low-pressure chemical vapor deposition (LPCVD) process. In an embodiment, the LPCVD process is performed at a temperature in a range from about 500 degrees Celsius to about 900 degrees Celsius, and for a process duration time in a range from about 3 hours to about 10 hours.

The high CTE layer 90 has a thickness 95. In an embodiment, the thickness 95 is less than about 2 um, for example in a range from about 0.5 um to about 2.0 um. The thickness 95 is not randomly chosen, but is rather calculated by a set of equations (to be discussed later). The thickness 95 is calculated to have an optimized value, such that the high CTE layer 90 can generate a compressive stress to counteract or balance against a tensile stress generated by the buffer layer 70 and a gallium nitride layer to be formed later. The calculation of the thickness 95 will be discussed in more detail later.

After the high CTE layers 80 and 90 are formed, the overall device is cooled to room temperature again. The CTE mismatches during the cooling will once again result in an approximately concave shape for the overall device. For the sake of simplicity, the concave shape is not illustrated in FIG. 3.

Figure 4:
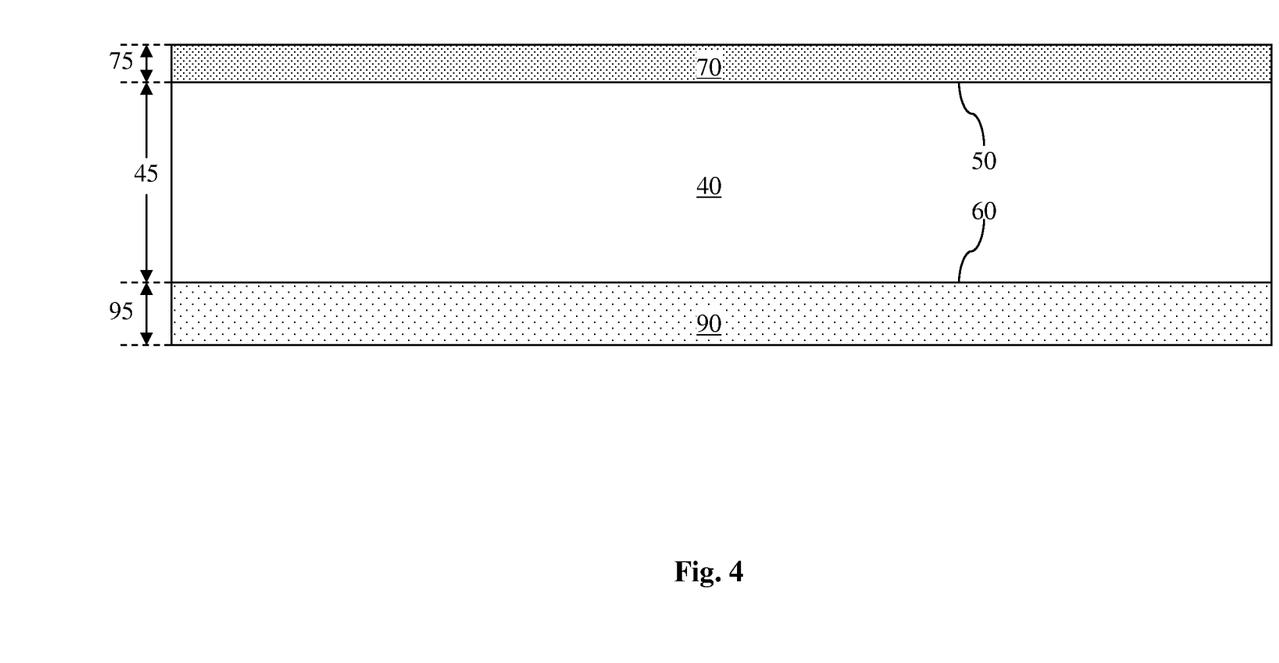

Referring now to FIG. 4, the high CTE layer 80 above the buffer layer 70 is removed. The removal may be carried out using a wet etching process known in the art, or another suitable process. The removal of the high CTE layer 80 will cause the stresses to shift within the overall device, such that the overall device—including the silicon wafer 40, the buffer layer 70, and the high CTE layer 90—to bend downwards from the edges. In other words, the edges of the overall device are pulled down by the high CTE layer 90 and will now have a convex shape. Once again, for reasons of simplicity, the convex shape is not specifically illustrated in FIG. 4.

Figure 5:
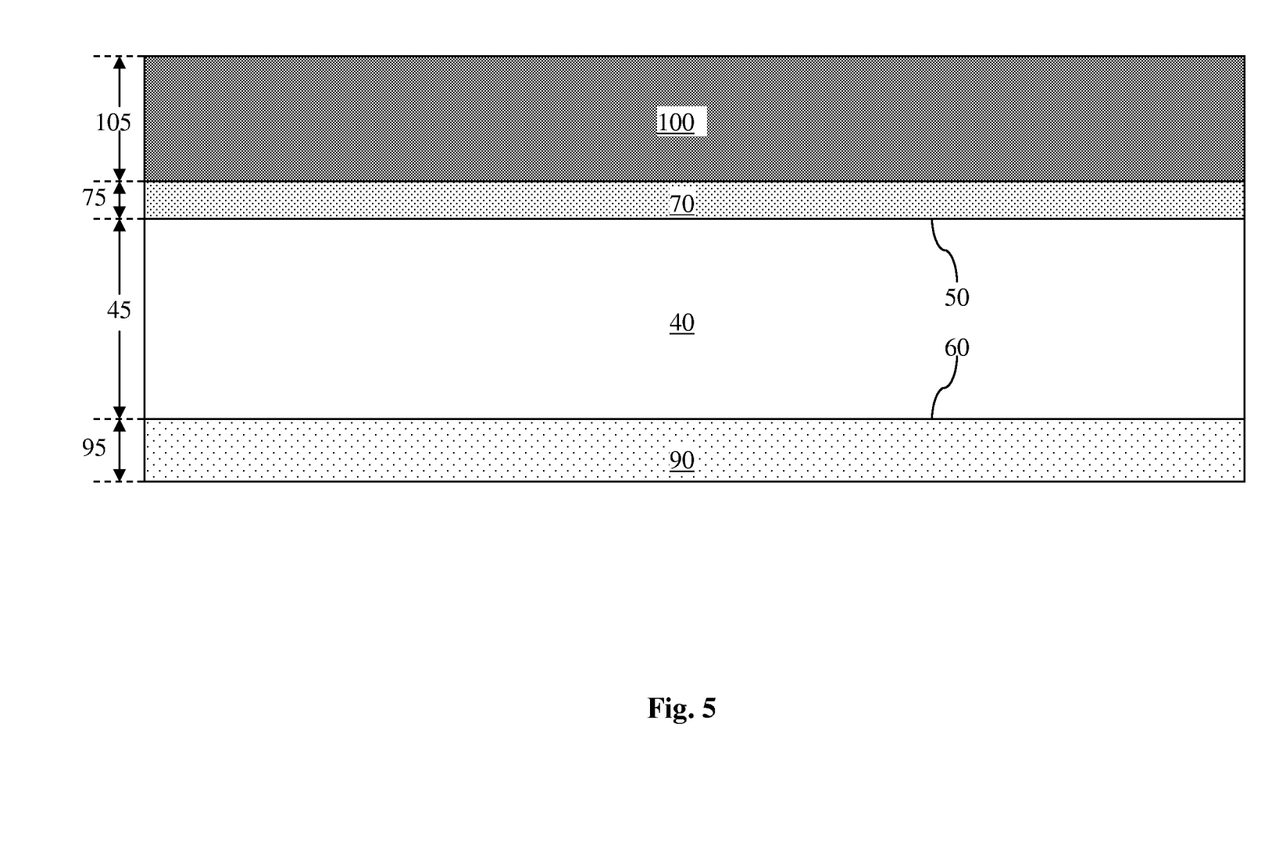

Referring now to FIG. 5, a gallium nitride layer 100 is formed over the buffer layer 70. The gallium nitride layer 100 may also be referred to as a III-V family or a III-V structure, because gallium is in the "III" family of the periodic table, and nitrogen is in the "V" family of the periodic table. A gallium nitride material may have a lattice constant that is in a range from about 3 to about 3.4 and a CTE that is in a range from about $5.1 \times 10^{-6}/°$ C. to about $6.1 \times 10^{-6}/°$ C. The gallium nitride layer 100 has a slightly higher lattice constant and a slightly higher CTE than the buffer layer 70.

In an embodiment, the gallium nitride layer 100 is formed by a MOCVD process. In an embodiment, the MOCVD process is performed at a temperature in a range from about 800 degrees Celsius to about 1400 degrees Celsius, and for a process duration time in a range from about 1 hour to about 3 hours. The gallium nitride layer 100 has a thickness 105. In an embodiment, the thickness 105 is in a range from about 1 um to about 4 um.

As discussed above, the silicon wafer 40 is chosen to have the silicon (111) surface so that its lattice constant is better matched with that of the buffer layer 70. By using the silicon wafer with the silicon (111) surface, and by adjusting the implementation scheme of the buffer layer 70, different lattice constant mismatches may be achieved at the various layer interfaces, which causes different stresses. Here, the lattice constant mismatches may be adjusted in a manner such that the entire device—including the silicon wafer 40 and the layers 70, 90 and 100—has a slightly convex shape at the high temperature range (from about 800 degrees Celsius to about 1400 degrees Celsius).

Thereafter, the overall device is cooled down to room temperature. According to an embodiment of the disclosure, the MOCVD processes used to form the buffer layer 70 and the gallium nitride layer 100 and the LPCVD process used to form the high CTE layers 80 and 90 are performed using different tools. Therefore, the silicon wafer 40 and the layers formed thereon have to be cooled after the formation of the buffer layer 70, after the formation of the high CTE layers 80 and 90, and after the formation of the gallium nitride layer 100.

As the overall device is cooled, the various layers contract according to their respective CTEs. A layer with a greater CTE contracts more than a layer with a lower CTE. The different rates of contraction will cause stress between adjacent layers. The amount of stress is also dependent on the thickness of the layers. For example, as a layer becomes thicker, its contribution to the amount of stress will increase accordingly.

Here, since the material composition of the buffer layer 70 is similar to that of the gallium nitride layer 100, and their CTEs are not too different, the buffer layer 70 and the gallium nitride layer 100 may roughly be viewed as a collective entity in performing stress calculations as well.

The high CTE layer 90 has a higher CTE than the silicon wafer 40. As cooling occurs, the buffer layer 70/gallium nitride layer 100 contract more than the silicon wafer 40, which creates tensile stress at the interface between the silicon wafer 40 and the buffer layer 70/gallium nitride layer 100. Meanwhile, the high CTE layer 90 contracts more than the silicon wafer 40 due to the higher CTE of the high CTE layer 90. This creates compressive stress that counteract against the tensile stress created by the contraction of the buffer layer 70/gallium nitride layer 100. Stated differently, the high CTE layer 90 and the buffer layer 70/gallium nitride layer 100 are pulling the silicon wafer 40 in opposite directions, which has a balancing effect. Without the high CTE layer 90, the overall device would have been pulled by the buffer layer 70/gallium nitride layer 100 to have a concave shape. Here, the high CTE layer 90 acts to reduce the pulling by the buffer layer 70/gallium nitride layer 100, and the final shape of the overall device is substantially flat.

In an embodiment, the thickness 95 of the high CTE layer 90 is calculated so that the stress created by the high CTE layer 90 will substantially balance against the stress created by the buffer layer 70/gallium nitride layer 100, as the overall device is cooled to the room temperature range. Even if the balancing does not occur perfectly, the remaining amount of stress can be easily absorbed by the silicon wafer 40 without causing damage, because the silicon wafer 40 is so much thicker than all the other layers. In this manner, the high CTE layer 90 helps reduce distortion to the overall device by generating stress to at least partially cancel out the stress generated by the buffer layer 70/gallium nitride layer 100. Had the high CTE layer 90 not been inserted, the stress due to the buffer layer 70/gallium nitride layer 100 would have distorted or warped the shape of the overall device, including the silicon wafer 40 and the gallium nitride layer 100. But since the high CTE layer 90 counteracts against the buffer layer 70/gallium nitride layer 100 during the cooling, the overall device will achieve a substantially flat shape after the cooling. For example, at the end of the cooling, the overall device may achieve a wafer distortion or wafer bow of less than 25 um.

The following equations provide more mathematical details to the stress calculations discussed above:

$$\sigma(E'_i, R_i, d_i) = \sigma_1 + \sigma_2 + \sigma_3$$

$$\sigma_1 = -\frac{E'_1 d_1^2}{6}\left(\frac{1}{R_2} - \frac{1}{R_1}\right) + \frac{E'_1 Y_1}{R_2}$$

$$\sigma_2 = -\frac{E'_1 d_1^2}{6 d_2}\left(\frac{1}{R_2} - \frac{1}{R_1}\right)$$

$$\sigma_3 = \frac{E'_1 d_1^2}{6 d_3}\left(\frac{1}{R_3} - \frac{1}{R_2}\right)$$

$$E'_i = \frac{E_i}{1 - v_i}$$

where σ is the stress of a layer, d is the thickness of a layer, E is the stress coefficient of a layer, R is the curvature of a layer, and v is the poisson's ratio of a layer. The subscripts 1, 2, and 3 refer the silicon wafer 40, the high CTE layer 90, and the combination of the buffer layer 70 and the gallium nitride layer 100 collectively.

Based on the above set of equations, the thickness 95 (appearing as $d_2$ in the equations) of the high CTE layer 90 can be calculated so that the overall device has a distortion that is less than about 25 um. For example, the sum of the stresses ($\sigma_1$, $\sigma_2$, and $\sigma_3$) may be set to 0, and $d_2$ can be calculated accordingly by manipulating the above equations. In one embodiment, $d_2$ (or the thickness 95) is calculated to be less than about 2 um, for example within a range from about 1 um to about 2 um.

From the discussions above, it can be seen that the present disclosure offers a method to form a gallium nitride material on a silicon wafer, without causing distortion to the wafer. This method can be applied in different fields of semiconductor technologies that may involve gallium nitride growth on a substrate. For example, it can be used to fabricate high power semiconductor devices, an example of which is shown in FIG. 6.

Figure 6:
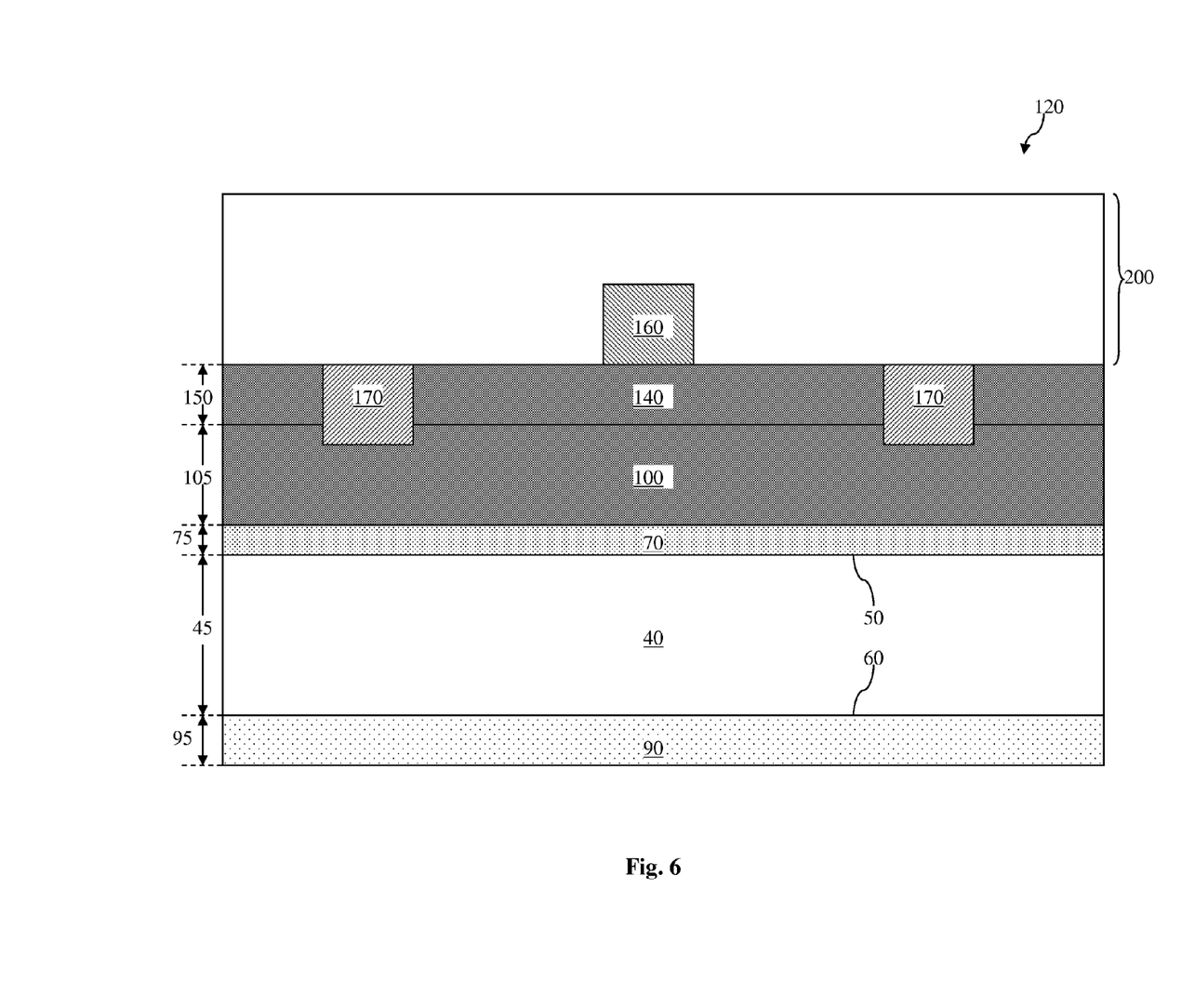

Referring to FIG. 6, a diagrammatic fragmentary cross-sectional side view of a high power semiconductor device 120 is illustrated. The semiconductor device 120 includes the silicon wafer 40, which is used in part to provide mechanical support for the layers formed thereon. The semiconductor device 120 includes the high CTE layer 90 for stress balancing purposes. The semiconductor device 120 also includes the silicon wafer 40, the buffer layer 70, and the gallium nitride layer 100. The gallium nitride layer 100 has the thickness 105. In an embodiment, the thickness 105 is in a range from about 1 um to about 4 um.

The high power semiconductor device 120 also includes an aluminum gallium nitride layer 140 that is formed over the gallium nitride layer 100. The aluminum gallium nitride layer 140 has a chemical formula $Al_xGa_{1-x}N$, where x is in a range from about 0.25 to 0.3. The aluminum gallium nitride layer 140 has a thickness 150. In an embodiment, the thickness 150 is in a range from about 10 nm to about 40 nm.

The high power semiconductor device 120 also includes a transistor formed by a gate device 160 and source/drain regions 170. The gate device 160 (or gate structure) is formed over the aluminum gallium nitride layer 140, and source/drain regions 170 are formed in the aluminum gallium nitride layer 140 and partially in the gallium nitride layer 100. The gate device 160 may include a gate dielectric component and a gate electrode component. The source/drain regions 170 may be formed by one or more doping or implantation processes. When the transistor device is turned on, a conductive channel is formed below the gate device 160 and between the source/drain regions 170. An electrical current will flow in the conductive channel.

The high power semiconductor device 120 also includes an interconnect structure 200 formed over the aluminum gallium nitride layer 140. The interconnect structure 200 includes a plurality of interconnect layers, also referred to as metal layers. Each metal layer contains a plurality of metal lines that route electrical signals. The metal layers are interconnected together by vias. Contacts are also formed over the gate device 160 and the source/drain regions 170 so that connections may be established with external devices. For the sake of simplicity, these metal lines, vias and contacts are not specifically illustrated in FIG. 7. Also, additional fabrication processes may be performed to finish the fabrication of the high power device 120, such as passivation, testing, and packaging processes. These processes are also not shown or discussed herein for reasons of simplicity.

Figure 7:
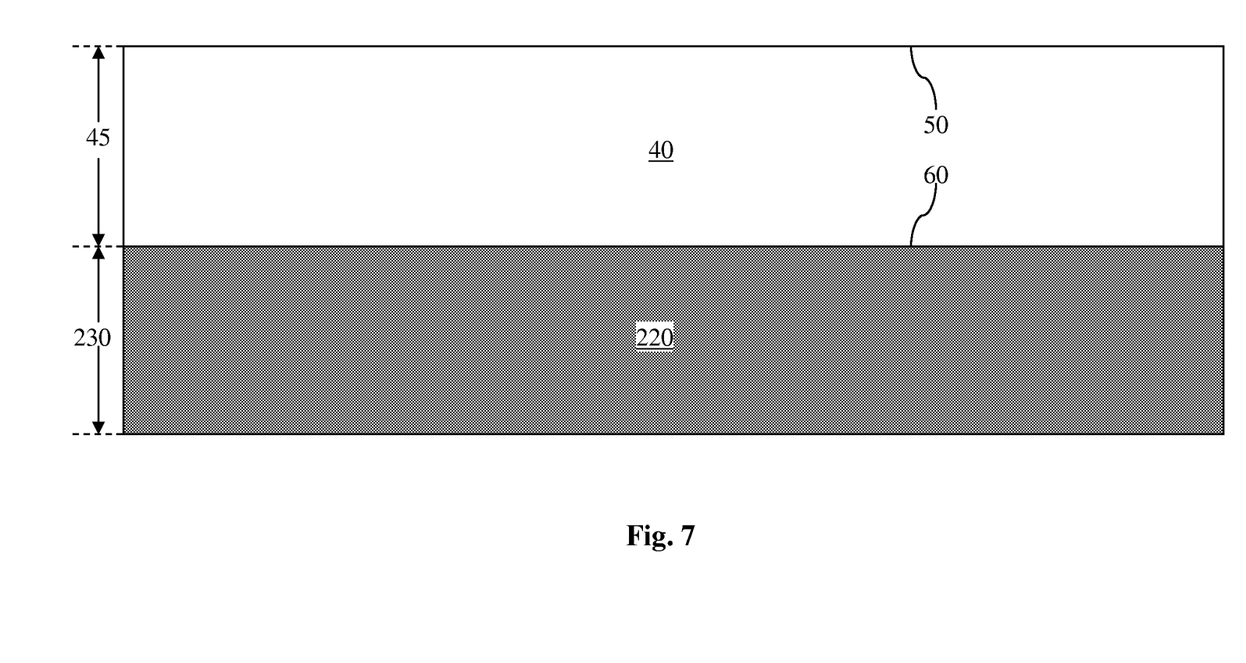
FIGS. 7-9 are diagrammatic fragmentary cross-sectional side views of a portion of another semiconductor device at various stages of fabrication in accordance with various aspects of the present disclosure.

It is understood that the high power device 120 illustrated in FIG. 7 and discussed above are provided merely to provide an example of how the high CTE layer 90 may be used to facilitate forming a gallium nitride layer on a silicon wafer. In other embodiments, the high CTE layer 90 may be used to form light-emitting diode (LED) devices, radio-frequency (RF) devices, and high electron mobility transistor (HEMT) devices. In fact, as long as it is desirable to form a III-V family layer on a silicon substrate without substantial distortion, the method and structure disclosed by the present disclosure may be applied.

Figure 8:
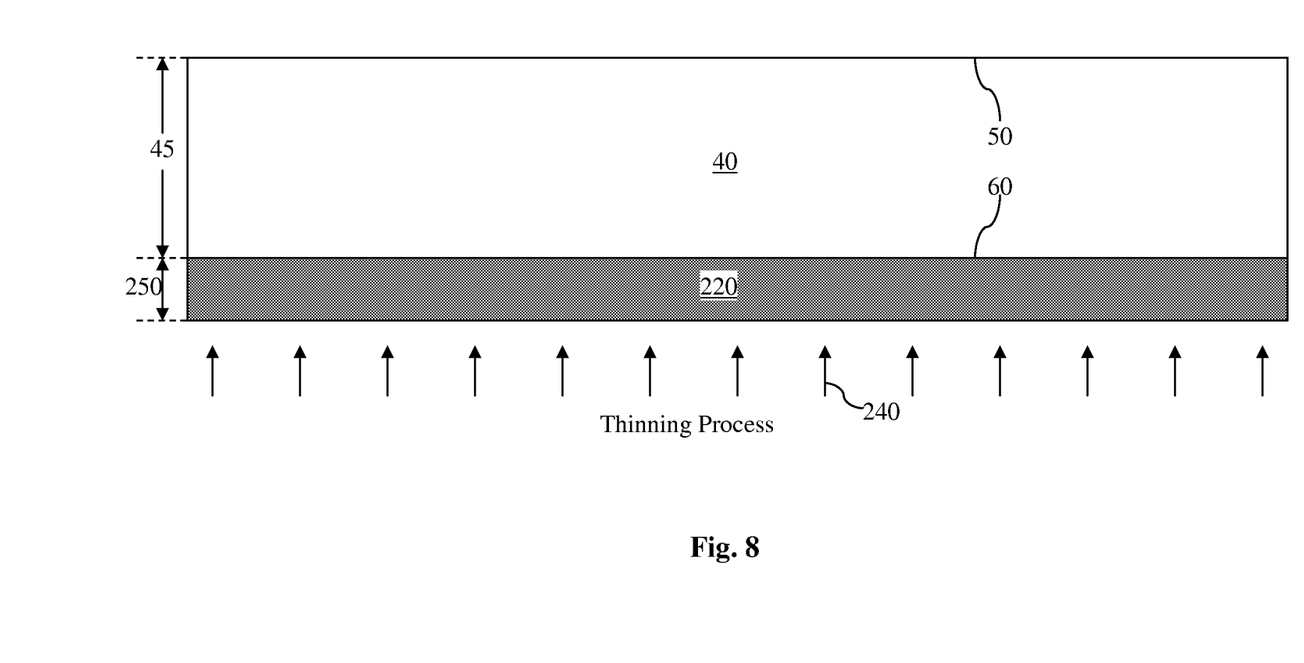
Figure 9:
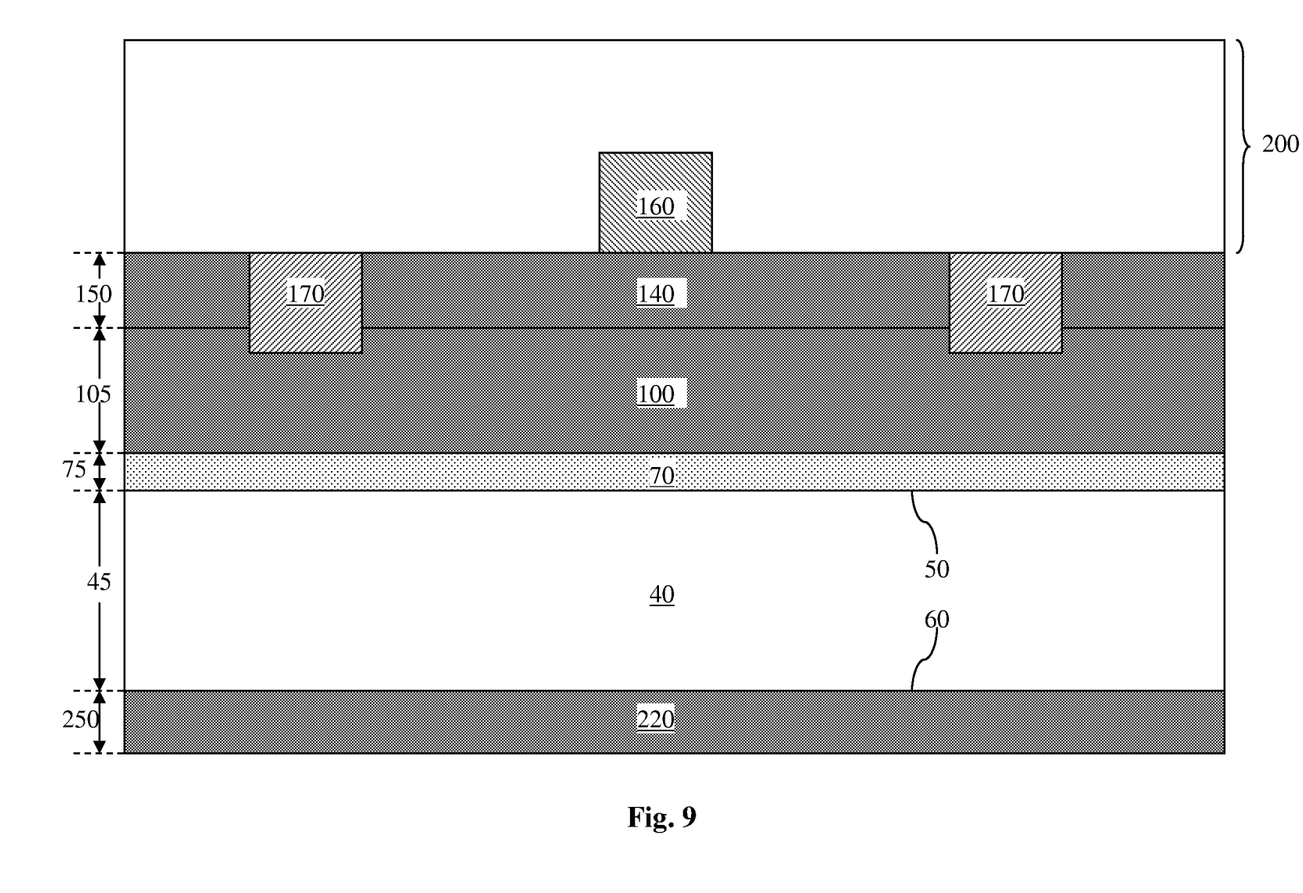

FIGS. 7-9 are diagrammatic fragmentary cross-sectional side views of a semiconductor device at different stages of fabrication according to another embodiment of the present disclosure. For the sake of consistency and clarity, similar elements are labeled the same in FIGS. 2-6 and 7-9.

Referring to FIG. 7, a glass layer 220 is bonded to the side 60 of the wafer 40. The glass layer 220 has a CTE that is in a range from about $3.0 \times 10^{-6}/°$ C. to about $5.5 \times 10^{-6}/°$ C. The glass layer 220 has a melting temperature in a range from about 1400 degrees Celsius to about 1800 degrees Celsius. In an embodiment, the glass layer 220 is doped to increase its CTE. The glass layer 220 has a thickness 230. In an embodiment, the thickness 230 is in a range from about 500 um to about 1500 um.

Referring now to FIG. 8, the glass layer 220 is thinned from the side 60 in a thinning process 240. The thinning process 240 substantially reduces the thickness of the glass layer 220 down to a thickness 250. In an embodiment, the thickness 250 is less than about 2 um, for example in a range from about 1 um to about 2 um. In an other embodiment, the sum of the thicknesses 45 and 250 is about the same as a thickness of another silicon wafer that could have been used instead of the silicon wafer 40, where the other silicon wafer would have had a silicon (100) surface as opposed to the silicon (111) surface of the silicon wafer 40. However, as discussed before, the use of the silicon (100) surface results in a greater lattice constant mismatch between the silicon wafer and the gallium nitride layer formed thereon, and as such is undesirable. Thus, the embodiment discussed herein does not use the silicon wafer with the (100) surface.

Referring now to FIG. 9, the buffer layer 70 is formed over the side 50 of the silicon wafer 40, and the gallium nitride layer 100 is formed over the buffer layer 70. The buffer layer 70 and the gallium nitride layer 100 may be formed using the same processing tools and at the same temperature range. Thereafter, the aluminum gallium nitride layer 140 is formed over the gallium nitride layer 100, the gate device 160 and the source/drain regions 170 are formed, and the interconnect structure 200 is also formed in a similar manner as those described above with reference to FIG. 6. Here, the thinned glass layer 220 serves as the high CTE layer and helps reduce distortion of the overall device as it is cooled.

Figure 10:
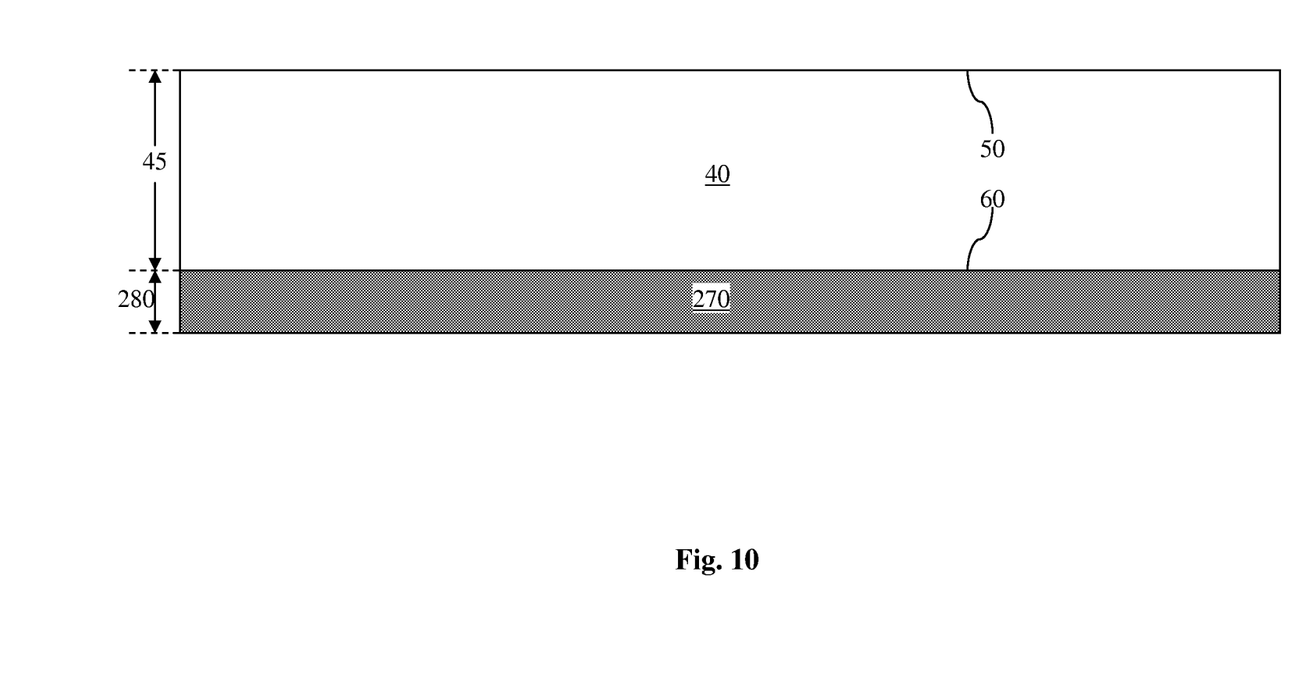
FIGS. 10-11 are diagrammatic fragmentary cross-sectional side views of a portion of yet another semiconductor device at various stages of fabrication in accordance with various aspects of the present disclosure.
Figure 11:
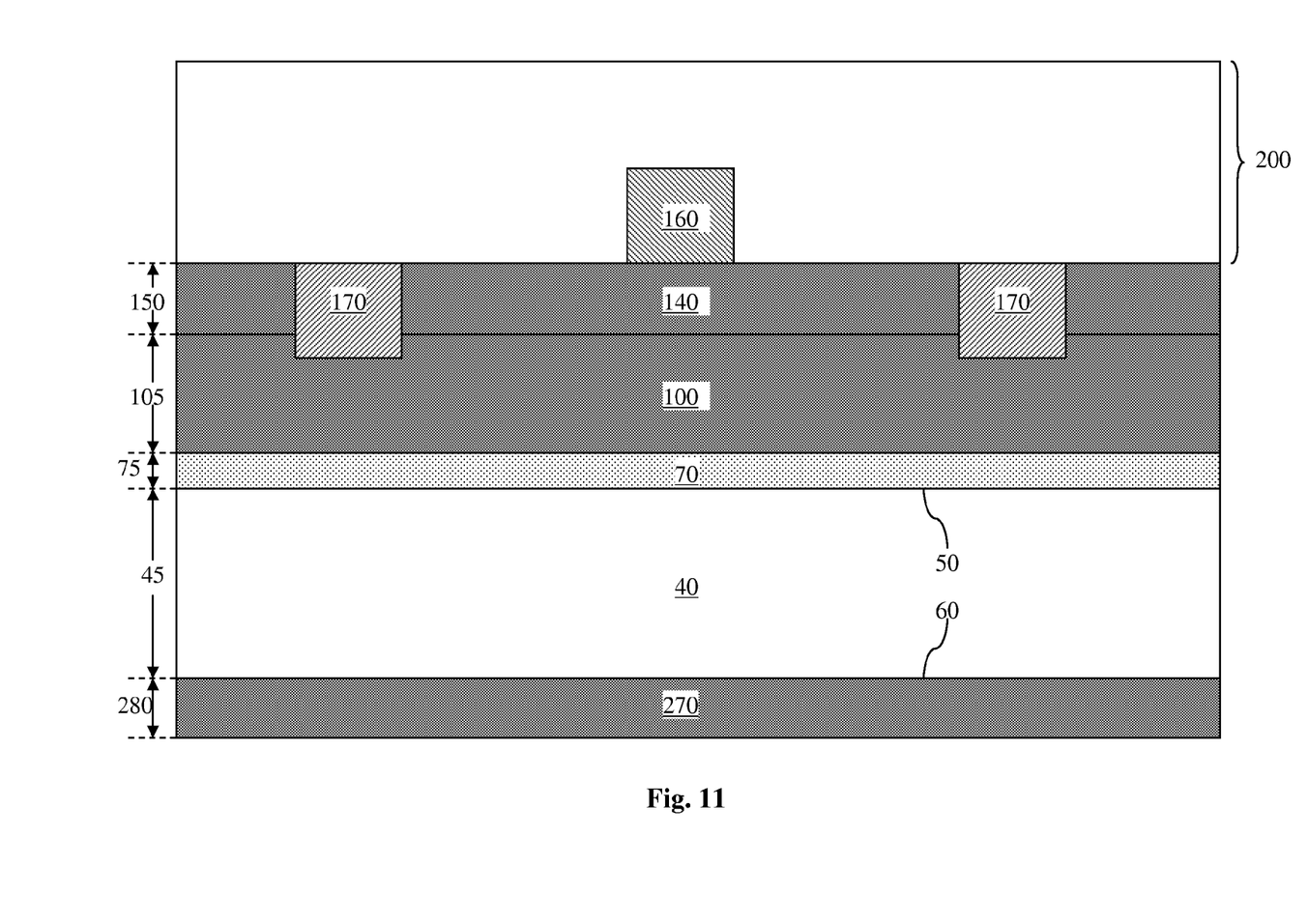

FIGS. 10-11 are diagrammatic fragmentary cross-sectional side views of a semiconductor device at different stages of fabrication according to yet another embodiment of the present disclosure. For the sake of consistency and clarity, similar elements are labeled the same in FIGS. 2-6 and 10-11.

Referring to FIG. 10, a silicon carbide layer 270 formed on the side 60 of the wafer 40. The silicon carbide layer 270 has a CTE that is in a range from about $4.3 \times 10^{-6}/°$ C. to about $4.7 \times 10^{-6}/°$ C. The silicon carbide layer 270 has a thickness 280. In an embodiment, the thickness 280 is in a range from about 500 um to about 1500 um.

Referring now to FIG. 11, the buffer layer 70, the gallium nitride layer 100, the aluminum gallium nitride layer 140, the gate device 160, the source/drain regions 170, and the interconnect structure 200 are all formed in a manner similar to those described above with reference to FIG. 6. Here, the silicon carbide layer 270 serves as the high CTE layer and helps reduce distortion of the overall device.

The embodiments of the present disclosure discussed above offer advantages over existing methods. It is understood, however, that other embodiments may offer different advantages, and that no particular advantage is required for any embodiment. One of the advantages is that the overall device will remain substantially flat during fabrication, which helps reduce wafer defects. In traditional fabrication processes, the wafer may become distorted at one stage or another. Wafer distortion is undesirable because it may lead to wafer defects, thus reducing yield and/or degrading device performing and quality.

In comparison, the embodiments discussed above utilize the high CTE layer 90 (or other similar high CTE layers) to help reduce wafer distortion during fabrication. When the overall device is cooled to a room temperature from the high temperature used to form the gallium nitride layer 100, the high CTE layer 90 helps counteract stresses created as a result of different CTEs and different contraction rates. The thickness 95 of the high CTE layer 90 may be calculated and implemented so that the stresses are still balanced as the overall device is cooled. Hence, the overall device is substantially flat after the cooling process, and therefore defects related to wafer distortion may be reduced.

Another advantage is that the high CTE layer 90 is inexpensive to form, and its fabrication is compatible with existing fabrication process flow. Therefore, the insertion of the high CTE layer between the silicon wafer and the gallium nitride layer has minimal impact on fabrication costs.

One of the broader forms of the present disclosure involves a method. The method includes providing a silicon wafer having opposite first and second sides. The method includes forming a layer over the first side of the silicon wafer. The layer has a coefficient-of-thermal-expansion (CTE) that is higher than that of silicon. The method includes forming a III-V family layer over the second side of the silicon wafer. The III-V family layer has a CTE that is higher than that of silicon.

Another of the broader forms of the present disclosure involves a method of fabricating a semiconductor device. The method includes providing a silicon substrate having opposite first and second sides. At least one of the first and second sides includes a silicon (111) surface. The method includes forming a high coefficient-of-thermal-expansion (CTE) layer on the first side of the silicon substrate. The high CTE layer has a CTE greater than the CTE of silicon. The method includes forming a buffer layer over the second side of the silicon substrate. The buffer layer has a CTE greater than the CTE of silicon. The method includes forming a III-V family layer over the buffer layer. The III-V family layer has a CTE greater than the CTE of the buffer layer.

Still another of the broader forms of the present disclosure involves a semiconductor device. The semiconductor device includes a silicon substrate having opposite first and second sides. The silicon substrate has a first coefficient-of-thermal-expansion (CTE). The semiconductor device includes a high CTE layer disposed over the first side of the silicon substrate. The high CTE layer has a third CTE that is greater than the first CTE. The semiconductor device includes a III-V family layer disposed over the second side of the silicon substrate. The III-V family layer has a second CTE that is greater than the first CTE.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   providing a wafer having opposite first and second sides, wherein the wafer has a silicon surface;
   forming a layer over the first side of the wafer, the layer having a coefficient-of-thermal-expansion (CTE) that is higher than that of the wafer;
   forming a buffer layer having a first buffer side and a second buffer side, the first buffer side disposed on the second side of the wafer;
   forming a III-V family layer on the second buffer side, the III-V family layer having a CTE that is higher than that of the wafer;
   forming a further III-V family layer over the III-V family layer, the further III-V family layer having a different material composition than the III-V family layer, and
   forming a source/drain component of a transistor in the further III-V family layer, wherein the source/drain component extends partially into the III-V family layer.

2. The method of claim 1, wherein the forming the layer over the first side of the wafer includes forming the layer to have a thickness such that a first stress created by the layer substantially balances against a second stress created by the buffer layer and by the III-V family layer such that the wafer absorbs any remaining stress without damage.

3. The method of claim 1, wherein the forming the layer having the CTE higher than that of the wafer is carried out in a manner so that the layer has a thickness that is less than about 2 microns.

4. The method of claim 1, wherein the forming the III-V family layer is carried out using an epitaxial process, the epitaxial process having a process temperature range from about 800 degrees Celsius to about 1400 degrees Celsius; and further including:
   after the forming the III-V family layer, cooling the III-V family layer and the wafer to a temperature range from about 20 degrees Celsius to about 30 degrees Celsius.

5. The method of claim 1, wherein the forming the III-V family layer is carried out in a manner so that the III-V family layer includes a gallium nitride material.

6. The method of claim 1, wherein the forming the layer having the CTE higher than that of the wafer is carried out in a manner so that the layer includes a material selected from the group consisting of silicon nitride, glass, and silicon carbide.

7. The method of claim 1, wherein:
   forming the buffer layer occurs before forming the III-V family layer; and
   the buffer layer has a CTE higher than that of the wafer but lower than that of the III-V family layer.

8. The method of claim 7, wherein the forming the layer having the CTE higher than that of the wafer is performed after the forming the buffer layer but before the forming the III-V family layer.

9. The method of claim 1, further comprising: forming a gate of the transistor over the further III-V family layer.

10. The method of claim 9, further comprising: forming an interconnect structure over the further III-V family layer.

11. A semiconductor device, comprising:
    a substrate having opposite first and second sides, the substrate having a first coefficient-of-thermal-expansion (CTE);
    a high CTE layer disposed over the first side of the substrate, the high CTE layer having a third CTE that is greater than the first CTE;
    a buffer layer having a first buffer side and a second buffer side, the first buffer side disposed on the second side of the substrate;
    a III-V family layer disposed on the second buffer side and also disposed over the second side of the substrate, the III-V family layer having a second CTE that is greater than the first CTE;
    a further III-V family layer disposed over the III-V family layer, the further III-V family layer having a different material composition than the III-V family layer, and
    a source/drain component of a transistor disposed in the further III-V family layer, wherein the source/drain component extends partially into the III-V family layer.

12. The semiconductor device of claim 11, further comprising: a gate of the transistor disposed over the further III-V family layer.

13. The semiconductor device of claim 12, further comprising: an interconnect structure disposed over the further III-V family layer.

14. The semiconductor device of claim 11, wherein:
    the high CTE layer includes a material selected from the group consisting of: silicon nitride, glass, and silicon carbide;
    the high CTE layer has a thickness that is in a range from about 0.5 microns to about 2 microns; and
    the III-V family layer includes a gallium nitride material.

15. The semiconductor device of claim 13, wherein the CTE of the high CTE layer is greater than about $3\times10^{-6}/°$ C.

16. The semiconductor device of claim 13, wherein the high CTE layer exerts a first stress, the first stress substantially balancing against a second stress created by the buffer layer and by the III-V family layer such that the substrate absorbs any remaining stress without damage.

17. The semiconductor device of claim 13, wherein the buffer layer includes a plurality of layers of aluminum nitride material.

18. A semiconductor device, comprising:
    a substrate having opposite first and second sides, the substrate having a first coefficient-of-thermal-expansion (CTE);
    a high CTE layer disposed over the first side of the substrate, the high CTE layer having a third CTE that is greater than the first CTE;
    a buffer layer having a first buffer side and a second buffer side, the first buffer side disposed on the second side of the substrate;
    a first III-V family layer disposed on the second buffer side and also disposed over the second side of the substrate, the first III-V family layer having a second CTE that is greater than the first CTE;
    a second III-V family layer disposed over the first III-V family layer, the first and second III-V family layers having different material compositions;
    a source/drain component of a transistor disposed in the second III-V family layer, wherein the source/drain component extends partially into the first III-V family layer; and
    a gate of the transistor disposed over the second III-V family layer;
    wherein the high CTE layer exerts a first stress, the first stress substantially balancing against a second stress created by the buffer layer and by the first III-V family layer such that the substrate absorbs any remaining stress without damage.

19. The semiconductor device of claim 18, wherein:

the high CTE layer includes a material selected from the group consisting of: silicon nitride, glass, and silicon carbide;

the high CTE layer has a thickness that is in a range from about 0.5 microns to about 2 microns;

the first III-V family layer includes a gallium nitride material;

the CTE of the high CTE layer is greater than about $3\times 10^{-6}/°$ C.; and the buffer layer includes a plurality of layers of aluminum nitride material.

* * * * *